United States Patent
Sorg et al.

(10) Patent No.: US 10,622,524 B2
(45) Date of Patent: Apr. 14, 2020

(54) CONVERTER FOR AN OPTOELECTRONIC COMPONENT, OPTOELECTRONIC COMPONENT, METHOD FOR FORMING A CONVERTER FOR AN OPTOELECTRONIC COMPONENT AND MATERIAL FOR A REFLECTOR OF AN OPTOELECTRONIC COMPONENT

(71) Applicant: OSRAM Opto Semiconductors GmbH, Regensburg (DE)

(72) Inventors: Jörg Erich Sorg, Regensburg (DE); Roland Schulz, Regensburg (DE); Florian Peskoller, Ingolstadt (DE); Alan Lenef, Belmont, MA (US); Christopher Tarry, Portsmouth, NH (US); Yi Zheng, Lynnfield, MA (US)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 16/101,168

(22) Filed: Aug. 10, 2018

(65) Prior Publication Data

US 2020/0052168 A1 Feb. 13, 2020

(51) Int. Cl.
H01L 33/50 (2010.01)
H01S 5/06 (2006.01)
H01L 33/60 (2010.01)

(52) U.S. Cl.
CPC .............. *H01L 33/50* (2013.01); *H01L 33/60* (2013.01); *H01S 5/0611* (2013.01)

(58) Field of Classification Search
CPC ......... H01L 33/50; H01L 33/60; H01S 5/0611
See application file for complete search history.

(56) References Cited

U.S. PATENT DOCUMENTS

| | | | |
|---|---|---|---|
| 2009/0072700 A1* | 3/2009 | Kameshima | C03C 14/004 313/483 |
| 2014/0001503 A1 | 1/2014 | Ahlstedt et al. | |
| 2016/0260873 A1* | 9/2016 | Yamada | H01L 33/502 |
| 2017/0023188 A1* | 1/2017 | Mima | F21K 9/64 |
| 2017/0137706 A1* | 5/2017 | Fujita | C09K 5/14 |
| 2017/0233647 A1* | 8/2017 | Sakawa | C09K 11/00 257/98 |
| 2018/0019384 A1* | 1/2018 | Abe | G02B 5/285 |

FOREIGN PATENT DOCUMENTS

| | | |
|---|---|---|
| EP | 2858132 A1 | 4/2015 |
| EP | 3147955 A1 | 3/2017 |

* cited by examiner

*Primary Examiner* — Fernando L Toledo
*Assistant Examiner* — Neil R Prasad
(74) *Attorney, Agent, or Firm* — Slater Matsil, LLP

(57) ABSTRACT

A converter for an optoelectronic component, an optoelectronic component, a method for forming a converter for an optoelectronic component and a material for a reflector of an optoelectronic component are disclosed. In an embodiment, a converter includes a conversion element for converting a wavelength of electromagnetic radiation which passes through at least a part of the conversion element and a reflector, wherein the reflector includes a reflector material which includes $MgF_2$ and/or an inorganic material as a matrix material in which a plurality of particles is embedded, wherein a refractive index of the matrix material amounts to at least 1 and at most 2, and wherein a refractive index of the particles amounts to at least 1.5.

20 Claims, 5 Drawing Sheets

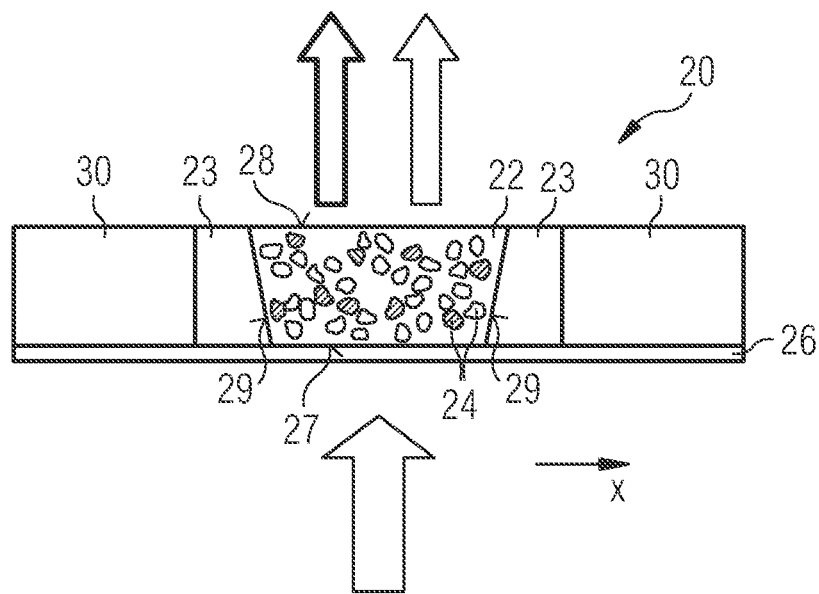
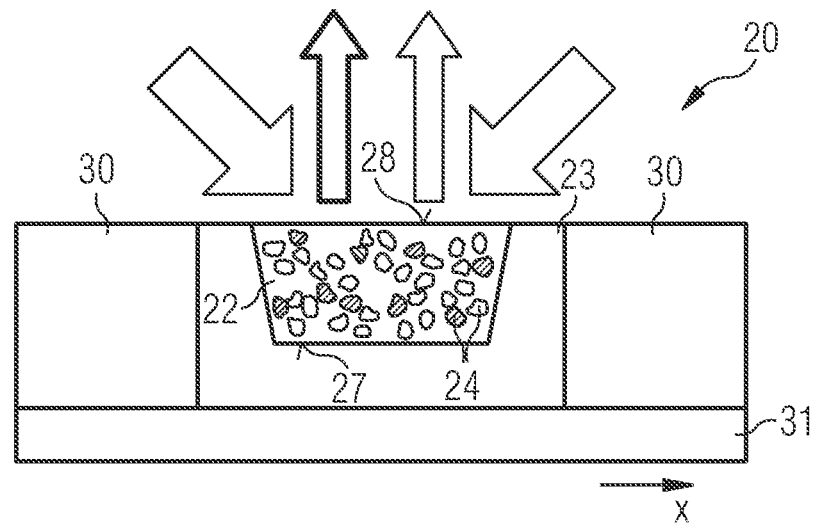

|    | T   | R     | F     |
|----|-----|-------|-------|
| S1 | 97  | 0.685 | 0.913 |
| S2 | 101 | 0.494 | 0.812 |
| S3 | 111 | 0.080 | 0.876 |

CONVERTER FOR AN OPTOELECTRONIC COMPONENT, OPTOELECTRONIC COMPONENT, METHOD FOR FORMING A CONVERTER FOR AN OPTOELECTRONIC COMPONENT AND MATERIAL FOR A REFLECTOR OF AN OPTOELECTRONIC COMPONENT

TECHNICAL FIELD

A converter for an optoelectronic component, an optoelectronic component, a method for forming a converter for an optoelectronic component and a material for a reflector of an optoelectronic component are provided.

SUMMARY

In at least one embodiment of the converter for an optoelectronic component, the converter comprises a conversion element for converting the wavelength of electromagnetic radiation which passes through at least a part of the conversion element. That can mean that the wavelength of electromagnetic radiation entering the conversion element is different from the wavelength of electromagnetic radiation leaving the conversion element. By passing through the conversion element the wavelength of electromagnetic radiation is at least partly changed. For example, the wavelength of electromagnetic radiation entering the conversion element can be smaller than the wavelength of electromagnetic radiation leaving the conversion element. It is further possible that the conversion element is configured to convert a range of wavelengths of electromagnetic radiation which passes through at least a part of the conversion element. For example, electromagnetic radiation of a first color can be converted into electromagnetic radiation of a second color by the conversion element. Thus, electromagnetic radiation of the second color or of a mixed color mixed from the first and the second color leaves the conversion element.

The converter with the conversion element can, for example, be employed in an optoelectronic component which comprises an optoelectronic semiconductor chip. In this case, the conversion element can be configured to convert the wavelength of electromagnetic radiation emitted by the optoelectronic semiconductor chip. Therefore, by employing the conversion element the wavelength or the color of the electromagnetic radiation emitted by the optoelectronic semiconductor chip can be tuned.

The conversion element can comprise a material which is non-absorbing or low-absorbing for at least a range of wavelengths. It is further possible that the conversion element comprises a transparent or a translucent material. This means, the conversion element can be at least partially transparent for electromagnetic radiation passing through at least a part of the conversion element.

In at least one embodiment of the converter, the converter comprises a reflector. The reflector is arranged to reflect electromagnetic radiation hitting the reflector. The reflector can be arranged adjacent to the conversion element. Thus, the reflector can be arranged to reflect electromagnetic radiation leaving the conversion element. The reflector can comprise a material with a high reflection coefficient. For instance, the reflector is a diffuse reflecting reflector. As an example, the reflector reflects at least 90% of the electromagnetic radiation hitting the reflector.

In at least one embodiment of the converter the reflector comprises a reflector material which comprises $MgF_2$ and/or an inorganic material, e.g., a transparent oxide, as a matrix material, in which a plurality of particles is embedded. The particles or a majority of the particles are completely surrounded by the matrix material. This means, the particles can be surrounded by the matrix material from all sides. Furthermore, the particles can be in direct contact with the matrix material. The matrix material is, for example, $HfO_2$, $Nb_2O_5$, $Ta_2O_5$, $CaF_2$, $BaF_2$, $CdF_2$, $CeF_3$, $SiO_2$, $CsB_3O_5$, $Zn_2SiO_4$, $Mg_2SiO_4$, $Y_2O_3$ or YAG. The particles can have a refractive index which is different from the refractive index of the matrix material. Furthermore, the reflector material is self-supporting. This can mean that the reflector material can act as a carrier. The converter can thus be free of an additional carrier.

In at least one embodiment of the converter a refractive index of the matrix material amounts to at least 1 and at most 2. It is further possible that the refractive index of the matrix material amounts to at least 1 and at most 1.7. It is further possible that the refractive index of the matrix material amounts to at least 1.2 and at most 1.5.

In at least one embodiment of the converter a refractive index of the particles amounts to at least 1.5. For visible light the refractive index of the particles can amount to at most 3. It is further possible that the refractive index of the particles amounts to at least 1.6. It is further possible that the refractive index of the particles amounts to at least 2.

In at least one embodiment of the converter, the converter comprises a conversion element for converting the wavelength of electromagnetic radiation which passes through at least a part of the conversion element, and a reflector, wherein the reflector comprises a reflector material which comprises $MgF_2$ and/or an inorganic material as a matrix material, in which a plurality of particles is embedded, a refractive index of the matrix material amounts to at least 1 and at most 2, and a refractive index of the particles amounts to at least 1.5.

It has been shown that a reflector with the reflector material shows a high reflectivity. Reflectors with a high reflectivity are required for a wide range of optoelectronic devices. Especially for laser devices, reflectors with a high reflectivity are required. At the same time high temperatures and a high luminance can arise in laser devices. In most cases, materials for reflectors are optimized for one of the requirements. The reflector material described herein combines several advantages.

Reflectors in optoelectronic devices can be employed to guide electromagnetic radiation emitted by a chip of the device towards a preferred radiation emission side. By arranging a reflector, for example, in the vicinity of a conversion element, electromagnetic radiation leaving the conversion element at sides which are not the preferred radiation emission side can be reflected back towards the conversion element by the reflector. The higher the reflectivity of a reflector is, the smaller are the losses of electromagnetic radiation within the device.

It has further been shown that the reflector material exhibits a high thermal robustness. Therefore, the reflector material is stable at high temperatures which can, for example, arise during production of the converter or during operation of a component in which the converter is incorporated. The reflector material is further stable under a high luminance, especially for blue light. With this, the converter is arranged to be employed in an optoelectronic component which comprises a laser.

Furthermore, the light penetration depth of the reflector material is low. This means, that the reflectivity of the reflector is high even for a small thickness of the reflector.

Thus, the reflector with the reflector material can advantageously be employed in devices or components which require a small size.

In addition, the reflector material has a high thermal conductivity. Thus, the reflector can be employed as a heat sink.

These properties render the reflector with the reflector material suitable for the employment in an optoelectronic component which comprises a laser. The reflector material has at the same time a high reflectivity and a high thermal robustness.

In at least one embodiment of the converter the difference between the refractive index of the matrix material and the refractive index of the material of the particles amounts to at least 0.1 and at most 1.5. In particular, the refractive index of the particles is larger than the refractive index of the matrix material.

In at least one embodiment of the converter the reflector material is a ceramic. The reflector material can have a high melting point and a low electrical conductivity. Advantageously, a ceramic has a high thermal robustness.

In at least one embodiment of the converter the particles embedded in the matrix material of the reflector material comprise $TiO_2$. The particles embedded in the matrix material can be formed by $TiO_2$. It is further possible that the particles embedded in the matrix material of the reflector material comprise at least one of the following materials: diamond, $Nd_2O_5$, $Ta_2O_5$. $TiO_2$, diamond, $Nd_2O_5$ and $Ta_2O_5$ have a refractive index which is larger than the refractive index of $MgF_2$. Due to the difference of the refractive indices, scattering at the reflector material is increased. Therefore, the reflectivity of the reflector material is increased as well.

In at least one embodiment of the converter the reflector material is an inorganic material. Advantageously, the reflector material is stable at high temperatures and at a high luminance.

In at least one embodiment of the converter the reflector material is free of alumina. It has been shown that the reflectivity of a material comprising alumina or alumina ceramics is decreased in comparison to a reflector material described herein. Thus, the reflector material has a higher reflectivity.

In at least one embodiment of the converter the reflector is in direct contact with the conversion element. The reflector can directly adjoin side surfaces of the conversion element at least in places. For example, the reflector can completely surround the conversion element in lateral directions, where the lateral directions extend parallel to a main plane of extension of the conversion element. It is further possible that the reflector is in direct contact with the conversion element at all side surfaces of the conversion element except for one. Since the reflector can be a diffuse reflector, there is no requirement for a very smooth interface between the reflector and the conversion element, as it is, for example, the case for metallic mirrors. Moreover, there is no specific requirement for the interface between the reflector and a potential carrier or holder of the reflector.

By arranging the reflector in direct contact with the conversion element, electromagnetic radiation leaving the conversion element can be reflected at the reflector. Due to the high reflectivity of the reflector material a high percentage of the electromagnetic radiation hitting the reflector is reflected. For example, the electromagnetic radiation can be reflected back towards the conversion element. Therefore, the absorption of electromagnetic radiation within the component can be minimized and most of the electromagnetic radiation can leave the conversion element at a desired side.

In at least one embodiment of the converter the reflector adjoins the conversion element in at least two directions. The reflector can, for example, adjoin the conversion element in two lateral directions which run both parallel to a main plane of extension of the conversion element. It is further possible that the reflector adjoins the conversion element at a bottom side of the conversion element, where the bottom side faces away from a top side of the conversion element. The reflector is advantageously arranged to reflect electromagnetic radiation leaving the conversion element back towards the conversion element, such that most of the electromagnetic radiation leaves the conversion element at at least one desired side of the conversion element.

In at least one embodiment of the converter the reflector material is formed by sintering. This means, the components of the reflector material are pressed together at an elevated temperature such that the reflector material is formed. For example, $MgF_2$ or the inorganic material and the particles can be provided as powders. During the sintering process the powders are pressed together such that a solid reflector material is formed. Moreover, the reflector material is self-supporting. In this way, a reflector material with a high reflectivity and a high thermal robustness can be formed.

In at least one embodiment of the converter the particle size distribution D50 of the particles embedded in the matrix material is at least 100 nm and less than 15 µm. It is further possible that the particle size distribution D50 of the particles embedded in the matrix material is at least 200 nm and less than 1 µm. It has been shown that for particles with this size the reflectivity of the reflector material is increased.

In at least one embodiment of the converter the concentration of the particles embedded in the matrix material of the reflector material amounts to at least 5% and at most 90%. It is further possible that the concentration of the particles embedded in the matrix material of the reflector material amounts to at least 25% and at most 70%. It has been shown that for these concentrations of the particles in the matrix material the reflectivity of the reflector material can be increased.

In at least one embodiment of the converter the porosity of the reflector material amounts to less than 2 volume percent. It has been shown that for a porosity of the reflector material of less than 2 volume percent the reflectivity of the reflector material is increased.

In at least one embodiment of the converter conversion particles are dispersed in a matrix material of the conversion element. This means, the conversion element comprises a matrix material and conversion particles. The matrix material can be transparent and/or non-absorbing for the electromagnetic radiation which is to be converted by the conversion element. The conversion particles are arranged to convert a wavelength of electromagnetic radiation passing the conversion element. Therefore, by employing the conversion element the wavelength or the color of electromagnetic radiation passing the conversion element can be tuned.

Furthermore, an optoelectronic component is provided. The optoelectronic component comprises the converter and an optoelectronic semiconductor chip. The semiconductor chip can, for example, be a light-emitting diode or a laser. The semiconductor chip can be configured to emit electromagnetic radiation within a specified wavelength range during operation of the optoelectronic component. The semiconductor chip can be arranged in such a way that at least a part of the electromagnetic radiation emitted by the semiconductor chip enters the conversion element. For example, the semiconductor chip can have a radiation exit side which faces the conversion element. As the reflector has a high reflectivity, losses of electromagnetic radiation within the optoelectronic component are minimized. Furthermore, the reflector is stable even for a high luminance of the electromagnetic radiation emitted by the semiconductor chip. In addition, as the reflector is thermally robust, material degradation is reduced and the optoelectronic component can be operated for long operation times.

Furthermore, a method for forming a converter for an optoelectronic component is provided. Preferably, with the methods described a converter as described above can be formed. This means that all features disclosed for the converter are also disclosed for the method for forming a converter for an optoelectronic component and vice versa.

According to at least one embodiment of the method for forming a converter for an optoelectronic component the method comprises the step of providing a conversion element for converting the wavelength of electromagnetic radiation which passes through at least a part of the conversion element. The conversion element can be formed by dispensing conversion particles in a matrix material of the conversion element.

According to at least one embodiment of the method, the method comprises the step of forming a reflector comprising a reflector material. The reflector can be formed before the conversion element is formed. Thus, the conversion element can be formed within a recess of the reflector. It is further possible that the reflector functions as a carrier for the conversion element.

According to at least one embodiment of the method, the reflector material is formed by sintering. The sintering can be carried out at an elevated temperature of, for example, approximately 800° C. During sintering the components of the reflector material are pressed together between two stamps or holders. An electric voltage is applied between the two stamps such that an electric current flows through the material between the stamps. In this way, the reflector material is heated. By sintering, the components of the reflector material are pressed together such that a solid and dense material is formed.

According to at least one embodiment of the method, the reflector material comprises $MgF_2$ and/or an inorganic material, e.g., a transparent oxide as a matrix material, in which a plurality of particles is embedded. Before forming the reflector material, $MgF_2$ or an inorganic material can be provided as a powder. During sintering the $MgF_2$ powder or the inorganic material are pressed together with the particles such that a solid compound is formed. After sintering the reflector material is self-supporting.

According to at least one embodiment of the method, a refractive index of the matrix material amounts to at least 1 and at most 2, and a refractive index of the particles amounts to at least 1.5. The refractive index of the particles can be larger than the refractive index of the matrix material. For visible light the refractive index of the particles can amount to at most 3.

By forming the reflector material via sintering a solid compound which is self-supporting and has a high reflectivity is formed. The reflector material combines several advantages as a high reflectivity, a high thermal robustness and a high thermal conductivity. Therefore, the reflector is suitable to be employed in an optoelectronic component which comprises a laser.

According to at least one embodiment of the method, during sintering the materials of the reflector material are pressed together. The materials of the reflector material can, for example, be pressed together with a pressure of at least 50 MPa, for example, approximately 60 MPa, during sintering. In this way, a solid compound which is self-supporting is formed during sintering.

According to at least one embodiment of the method, the particles embedded in the matrix material of the reflector material comprise $TiO_2$. The particles embedded in the matrix material can be formed by $TiO_2$. It is further possible that the particles embedded in the matrix material of the reflector material comprise at least one of the following materials: diamond, $Nd_2O_5$, $Ta_2O_5$. $TiO_2$, diamond, $Nd_2O_5$ and $Ta_2O_5$ can have a refractive index which is larger than the refractive index of the matrix material. Due to the difference of the refractive indices, scattering at the reflector material is increased. Therefore, the reflectivity of the reflector material is increased as well.

According to at least one embodiment of the method, the reflector material is formed by spark-plasma-sintering. This means, an electric current flows through the two stamps and the reflector material during sintering. In this way, a high density of the reflector material can be achieved. In addition, the desired porosity of the reflector material can be achieved.

Furthermore, a material for a reflector of an optoelectronic component is provided. The material comprises $MgF_2$ as a matrix material, and $TiO_2$ particles incorporated in the matrix material, where the particle size distribution D50 of the $TiO_2$ particles is at least 100 nm and less than 15 μm. The material has the advantages of a high reflectivity, a high thermal robustness and a high thermal conductivity. Therefore, the material is suitable to be employed in a reflector of an optoelectronic component.

BRIEF DESCRIPTION OF THE DRAWINGS

The following description of figures may further illustrate and explain exemplary embodiments. Components that are functionally identical or have an identical effect are denoted by identical references. Identical or effectively identical components might be described only with respect to the figures where they occur first. Their description is not necessarily repeated in successive figures.

FIGS. 2A and 2B show cut-away views through exemplary embodiments of the converter;

DETAILED DESCRIPTION OF ILLUSTRATIVE EMBODIMENTS

Figure 1A:
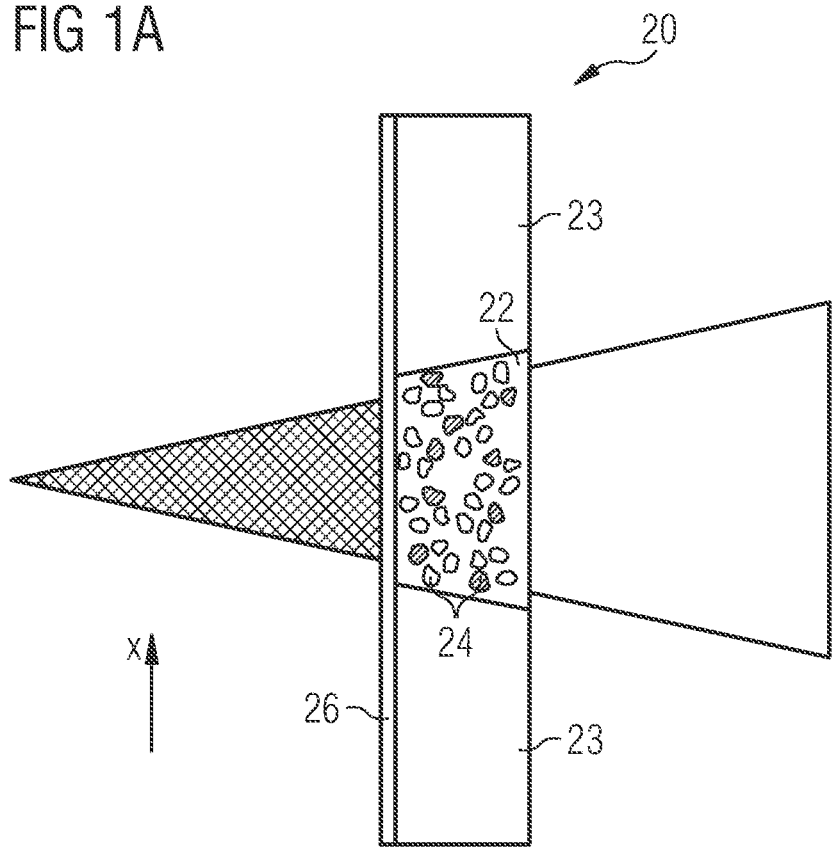
FIGS. 1A and 1B show schematic cross sections through converters.

In FIG. 1A a schematic cross section through a converter 20 which is no embodiment of the converter 20 described herein is shown. The converter 20 comprises a conversion element 22 and a reflector 23 which are arranged on a dichroic filter 26. The conversion element 22 comprises a matrix material in which conversion particles 24 are embedded. The conversion element 22 is arranged to convert electromagnetic radiation passing the conversion element 22. The reflector 23 surrounds the conversion element 22 in lateral directions x which extend parallel to a main plane of extension of the dichroic filter 26. The reflector 23 is arranged to reflect electromagnetic radiation hitting the reflector 23.

The converter 20 is arranged in a transmissive configuration. This means, a light source is arranged at a first side 27 of the converter 20. Electromagnetic radiation emitted by the light source passes the converter 20 through the dichroic filter 26 and the conversion element 22 towards a second side 28 of the converter 20 which faces away from the first side 27. In this way, electromagnetic radiation emitted by the light source passes the conversion element 22. The opening angle of the electromagnetic radiation emitted by the light source is shown schematically. By passing the conversion element 22 the wavelength of the electromagnetic radiation is converted. The electromagnetic radiation passing the conversion element 22 is scattered at the conversion particles 24. Therefore, at least a part of the electromagnetic radiation leaves the conversion element 22 at side surfaces 29 which extend traverse to the main plane of extension of the dichroic filter 26. The electromagnetic radiation leaving the conversion element 22 at the side surfaces 29 can be reflected at the reflector 23 back towards the conversion element 22. In this way, most of the electromagnetic radiation is emitted at the second side 28 of the converter 20. Such a converter 20 can be employed in optoelectronic devices where it is desired to tune the wavelength of the emitted electromagnetic radiation.

Figure 1B:
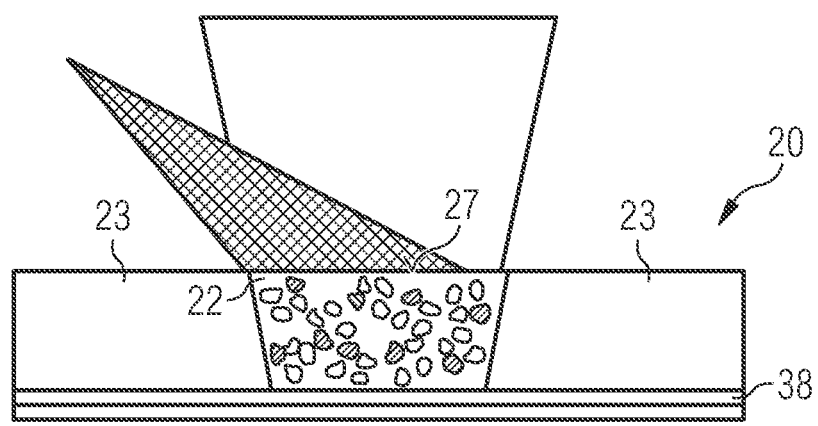

In FIG. 1B a schematic cross section through a converter 20 which is no embodiment of the converter 20 described herein is shown. In comparison to the converter 20 which is shown in FIG. 1A, here the converter 20 is arranged in a reflective configuration. This means, the conversion element 22 is arranged on a carrier 38 which is reflective. A light source is arranged in such a way, that the electromagnetic radiation emitted by the light source hits the conversion element 22 at a first side 27. Electromagnetic radiation entering the conversion element 22 passes the conversion element 22 and can be reflected by the carrier 38 or the reflector 23 which surrounds the conversion element 22. Thus, the converted electromagnetic radiation leaves the conversion element 22 at the first side 27.

The converters 20 shown in FIGS. 1A and 1B are particularly suitable to be employed in laser devices.

In FIG. 2A a cutaway view of an exemplary embodiment of the converter 20 is shown. Similar to FIG. 1, the converter 20 is arranged in a transmissive configuration. The converter 20 is arranged to be employed in an optoelectronic component 21. The converter 20 comprises a conversion element 22 for converting the wavelength of electromagnetic radiation which passes through at least a part of the conversion element 22. The conversion element 22 comprises a matrix material in which conversion particles 24 are dispersed. The conversion element 22 is arranged on a dichroic filter 26. A first side 27 of the conversion element 22 faces the dichroic filter 26 and a second side 28 of the conversion element 22 faces away from the first side 27. Furthermore, the conversion element 22 comprises side surfaces 29 which run traverse to the main plane of extension of the dichroic filter 26.

The converter 20 further comprises a reflector 23. The reflector 23 is arranged adjacent to the conversion element 22. In lateral directions x the reflector 23 completely surrounds the conversion element 22. The first side 27 and the second side 28 of the conversion element 22 are free of the reflector 23. At the side surfaces 29 the reflector 23 is in direct contact with the conversion element 22. The reflector 23 comprises a reflector material which comprises $MgF_2$ and/or an inorganic material as a matrix material, in which a plurality of particles is embedded. The difference between the refractive index of the matrix material and the refractive index of the material of the particles amounts to at least 0.1 and at most 1.5.

The reflector material is a ceramic and the particles embedded in the matrix material of the reflector material can comprise $TiO_2$. Therefore, the reflector material is an inorganic material and it is free of alumina. The particle size distribution D50 of the particles embedded in the matrix material is at least 100 nm and less than 15 µm. Furthermore, the concentration of the particles embedded in the matrix material of the reflector material amounts to at least 5% and at most 90%. The porosity of the reflector material amounts to less than 2 volume percent.

The reflector 23 is surrounded by a holder 30 in lateral directions x. The holder 30 stabilizes the converter 20.

The converter 20 can be employed in an optoelectronic component 21 where electromagnetic radiation is emitted by a light source, for example, a laser, and directed towards the conversion element 22. The direction of propagation of the radiation is shown by arrows. The wavelength of electromagnetic radiation emitted by the light source is converted or at least partially converted while the electromagnetic radiation passes the conversion element 22. After the conversion and possible reflection at the reflector 23 most of the electromagnetic radiation leaves the conversion element 22 at the second side 28.

The part of the electromagnetic radiation passing the conversion element 22 which is not scattered at any conversion particles 24 is not converted. Therefore, electromagnetic radiation with a converted wavelength and electromagnetic radiation with the wavelength emitted by the light source can leave the conversion element 22 at the second side 28. Thus, in this embodiment the converter 20 is employed in a transmissive configuration.

The converter 20 can be formed by providing the conversion element 22 and forming the reflector 23 which comprises the reflector material. The reflector material is formed by sintering, for example, by spark-plasma-sintering. During sintering $MgF_2$ and/or an inorganic material and a plurality of particles is pressed together.

In FIG. 2B a cutaway view of a further exemplary embodiment of the converter 20 is shown. In this embodiment the converter 20 is arranged in a reflective configuration. The conversion element 22 is surrounded by the reflector 23 in lateral directions x and at the first side 27 of the conversion element 22. The reflector 23 is surrounded by the holder 30 in lateral directions x. The conversion element 22, the reflector 23 and the holder 30 are arranged on a heat sink 31. The heat sink 31 is arranged at a side of the reflector 23 which faces away from the conversion element 22.

Electromagnetic radiation emitted by a light source enters the conversion element 22 at the second side 28 of the conversion element 22. The electromagnetic radiation entering the conversion element 22 can be scattered at conversion particles 24, be reflected at the reflector 23 and leave the conversion element 22 at the second side 28. As the reflector 23 surrounds the conversion element 22 from all sides except for the second side 28, electromagnetic radiation leaving the conversion element 22 at a side which is not the second side 28 is reflected back to the conversion element 22 by the reflector 23. It is possible that a part of the electromagnetic radiation entering the conversion element 22 is not converted. Therefore, electromagnetic radiation with an unmodified wavelength can leave the conversion element 22 at the second side 28.

As the reflector material has a high thermal conductivity heat can efficiently be transferred from the conversion element 22 to the heat sink 31.

For the embodiments of the converter 20 shown in FIGS. 2A and 2B it is advantageous that the reflector material has a high reflectivity, as losses within the converter 20 are minimized. Furthermore, since the light penetration depth of the reflector material is low, the size of the reflector 23 and thus of the converter 20 can be kept small. In addition, as the reflector material has a high thermal robustness the light source can be a laser or the electromagnetic radiation emitted by the light source can have a high luminance.

Figures 3, 4:
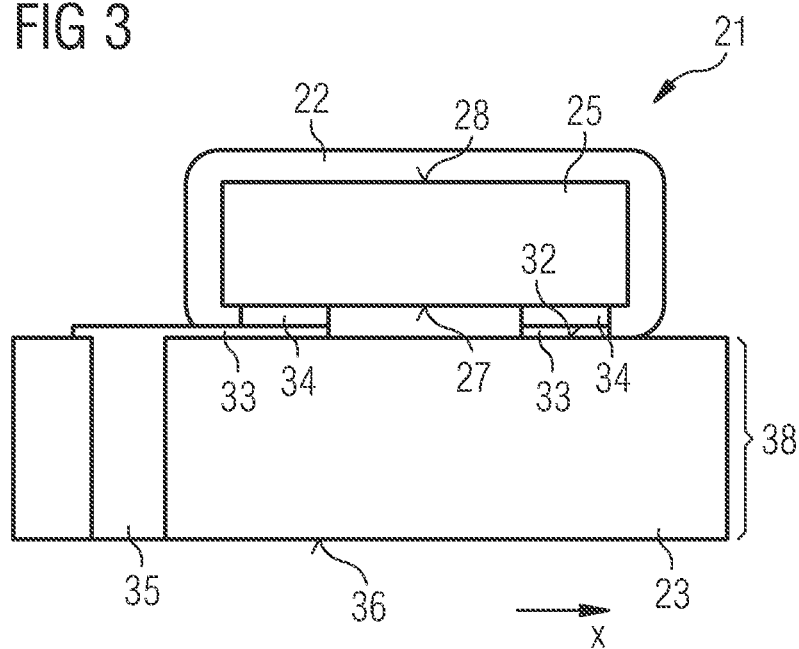
FIG. 3 shows a cut-away view of an exemplary embodiment of an optoelectronic component.
In FIGS. 4 and 5 optical properties of two converters and an embodiment of the converter are compared.

In FIG. 3 a cutaway view of an exemplary embodiment of the optoelectronic component 21 is shown. A semiconductor chip 25 is surrounded by a conversion element 22. The semiconductor chip 25 can, for example, be a light-emitting diode. The conversion element 22 can completely surround the semiconductor chip 25 in lateral directions x and at a second side 28 of the semiconductor chip 25. At a first side 27 of the semiconductor chip 25 which faces away from the second side 28 the semiconductor chip 25 is partially covered by the conversion element 22. The semiconductor chip 25 and the conversion element 22 are arranged on a carrier 38. At a top side 32 of the carrier 38 electrical contacts 33 are arranged.

Via interconnects 34 the electrical contacts 33 are electrically connected with the semiconductor chip 25. The interconnects 34 are arranged at the first side 27 of the semiconductor chip 25. The electrical contacts 33 are electrically connected with at least one through-contact 35 which extends through the carrier 38 from the top side 32 to a bottom side 36 which faces away from the top side 32. The through-contact 35 can comprise an electrically conductive material. The carrier 38 comprises the reflector 23 which comprises the reflector material. The reflector 23 is arranged adjacent to the conversion element 22. Therefore, electromagnetic radiation leaving the conversion element 22 in the direction of the carrier 38 is reflected at the reflector 23 back towards the conversion element 22. As the reflector material is a ceramic, the reflector 23 can act as the carrier 38.

Figure 5:
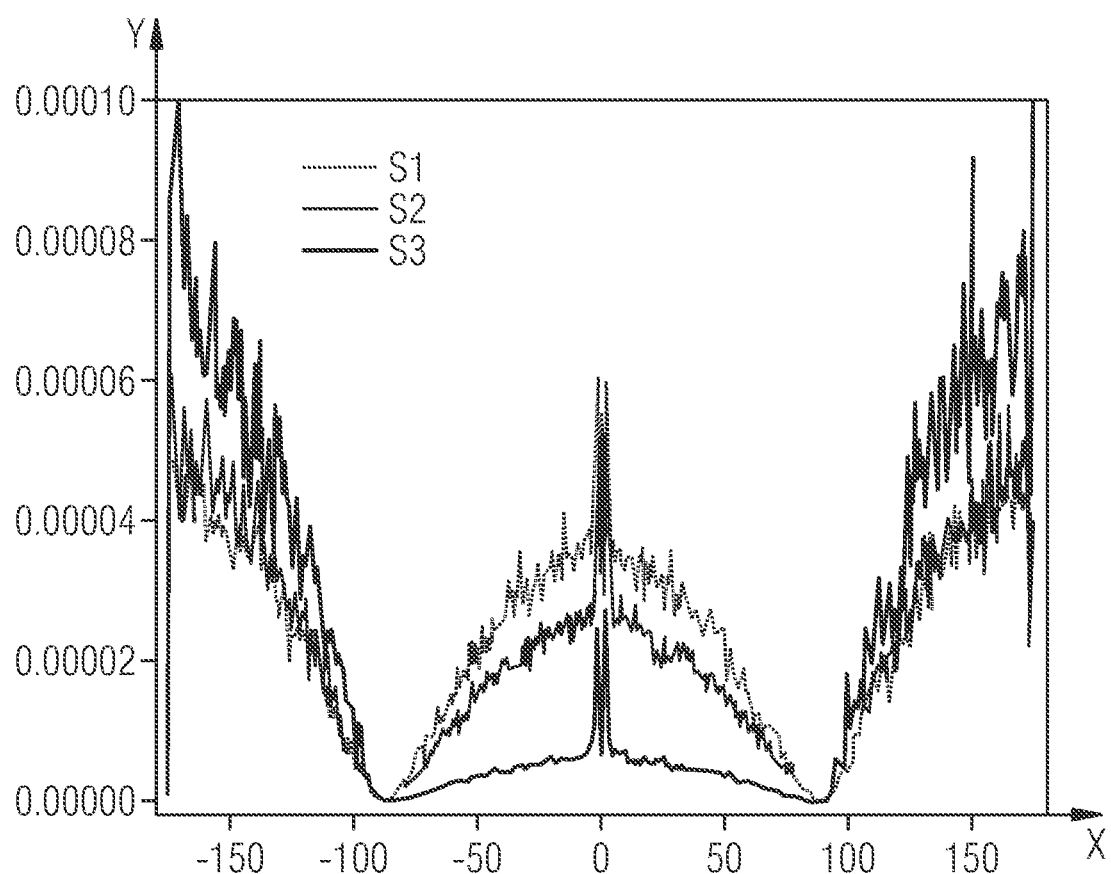

With FIGS. 4 and 5 the optical properties of two reflector materials are compared to the optical properties of an exemplary embodiment of the reflector material of the converter 20 described herein.

For a first sample S1 and a second sample S2, the reflector material consists of alumina. The third sample S3 is an exemplary embodiment of the reflector material of the converter 20. In the third sample S3 the reflector material comprises $MgF_2$ and $TiO_2$ particles. All three samples S1, S2, S3 are provided with a thickness of approximately 100 μm.

For all three samples S1, S2, S3 the ratio of forward to backward scattering and an estimate of the fraction of total scattered power to the incident laser power are determined. The results are shown in the table shown in FIG. 4. Each row corresponds to one of the samples S1, S2, S3. In the first column the thickness T of each sample is given in μm. In the second column the ratio R of forward to backward scattering is provided. In the third column an estimate of the fraction F of the total scattered power to the incident laser power is given. A small value of the ratio of forward to backward scattering relates to a high reflectivity. Therefore, the reflectivity of the reflector material described herein is substantially improved in comparison to the other two samples. The fraction of the total scattered power to the incident laser power gives an estimate of the power absorbed by the respective reflector material and is similar for all three samples. As the absorption is small also for the reflector material described herein, the reflector 23 can be employed as a diffuse reflector.

In FIG. 5 bi-directional scattering distribution measurements (BSDF) for the three samples S1, S2, S3 are shown. On the x-axis the angle is plotted in degrees. On the y-axis the bi-directional scattering distribution is plotted. For a wide range of angles sample S3 shows the greatest backscattering and thus the highest reflectivity.

Figure 6:
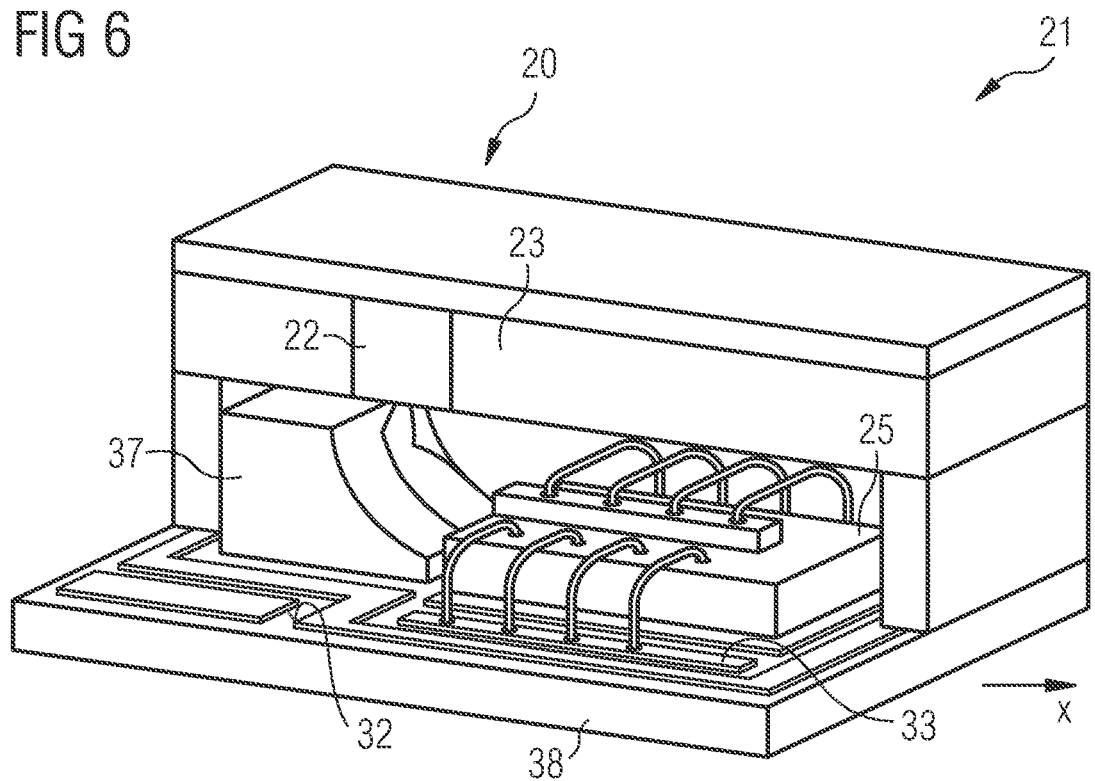
FIGS. 6 and 7 show cutaway views of exemplary embodiments of an optoelectronic component.

In FIG. 6 a cutaway view of an exemplary embodiment of an optoelectronic component 21 is shown. The optoelectronic component 21 comprises the converter 20 and an optoelectronic semiconductor chip 25. In this case the optoelectronic semiconductor chip 25 is an edge-emitting laser diode. The semiconductor chip 25 is arranged on a carrier 38. On a top side 32 of the carrier 38 electrical contacts 33 are arranged which are electrically connected with the semiconductor chip 25. Electromagnetic radiation emitted by the semiconductor chip 25 during operation is deflected at an optical element 37 in a direction which is perpendicular to the main plane of extension of the carrier 38. On a side of the semiconductor chip 25 facing away from the carrier 38 the converter 20 is arranged. The converter 20 is arranged in such a way that the electromagnetic radiation deflected at the optical 37 enters the conversion element 22. In lateral directions x the conversion element 22 is surrounded by the reflector 23. At a side facing away from the semiconductor chip 25 electromagnetic radiation which passes the conversion element 22 can leave the optoelectronic component 21. Thus, the converter 20 is arranged in a transmissive configuration.

Figure 7:
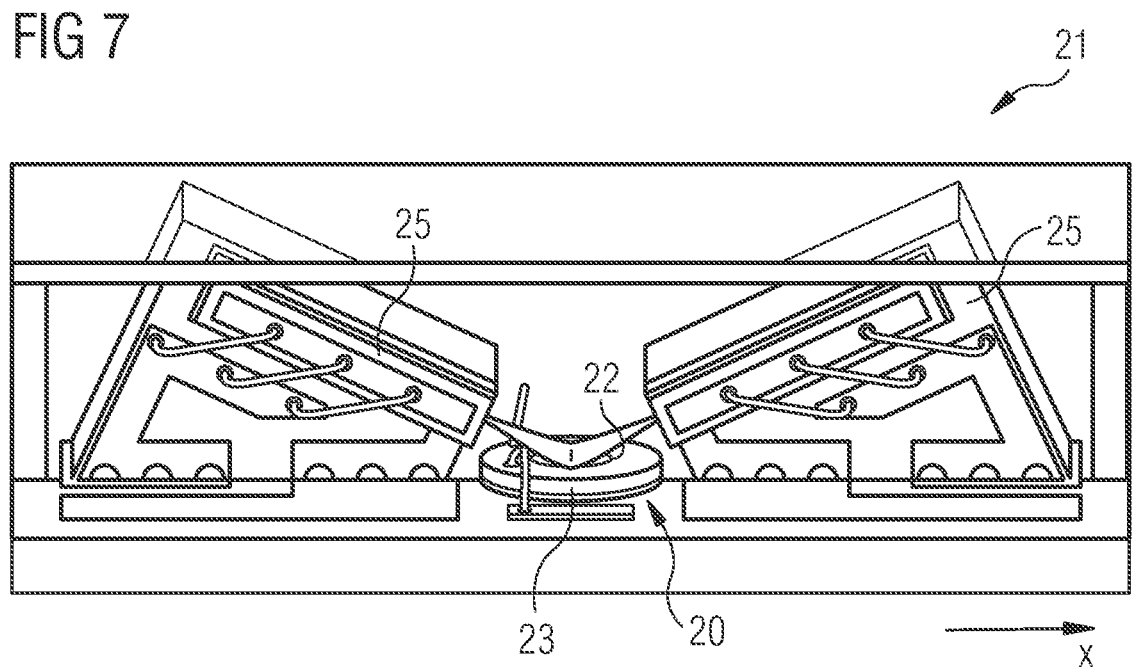

In FIG. 7 a cutaway view of a further exemplary embodiment of the optoelectronic component 21 is shown. The optoelectronic component 21 comprises the converter 20 and two optoelectronic semiconductor chips 25. The semiconductor chips 25 are edge-emitting laser diodes. The converter 20 is arranged between the two semiconductor chips 25 in a lateral direction x in such a way that most of the electromagnetic radiation emitted by the semiconductor chips 25 hits the conversion element 22. The converter 20 has the setup which is shown in FIG. 1B. This means it is arranged in a reflective configuration. The electromagnetic radiation entering the conversion element 22 can be reflected at the reflector 23 and leave the optoelectronic component 21 in a direction which runs traverse or perpendicular to the main plane of extension of the converter 20.

The description with the aid of the exemplary embodiments does not limit the invention thereto. Rather, the invention comprises any new feature and any combination of features, which in particular includes any combination of features in the patent claims, even if this feature or this combination is not itself explicitly stated in the patent claims or exemplary embodiments.

What is claimed is:

1. A converter for an optoelectronic component, the converter comprising:
   a conversion element configured to convert a wavelength of electromagnetic radiation which passes through at least a part of the conversion element; and
   a reflector,
   wherein the reflector comprises a reflector material which comprises $MgF_2$ and/or an inorganic material as a matrix material in which a plurality of particles is embedded,
   wherein a refractive index of the matrix material amounts to at least 1 and at most 2, and wherein a refractive index of the particles amounts to at least 1.5.

2. The converter according to claim 1, wherein a difference between the refractive index of the matrix material and the refractive index of a material of the particles amounts to at least 0.1 and at most 1.5.

3. The converter according to claim 1, wherein the reflector material is a ceramic.

4. The converter according to claim 1, wherein the particles embedded in the matrix material of the reflector material comprise $TiO_2$.

5. The converter according to claim 1, wherein the reflector material is an inorganic material.

6. The converter according to claim 1, wherein the reflector material is free of alumina.

7. The converter according to claim 1, wherein the reflector is in direct contact with the conversion element.

8. The converter according to claim 1, wherein the reflector adjoins the conversion element in at least two directions.

9. The converter according to claim 1, wherein the reflector material is formed by sintering.

10. The converter according to claim 1, wherein a particle size distribution D50 of the particles embedded in the matrix material is at least 100 nm and less than 15 μm.

11. The converter according to claim 1, wherein a concentration of the particles embedded in the matrix material of the reflector material amounts to at least 5% and at most 90%.

12. The converter according to claim 1, wherein a porosity of the reflector material amounts to less than 2 volume percent.

13. The converter according to claim 1, wherein conversion particles are dispersed in the matrix material of the conversion element.

14. An optoelectronic component comprising:
the converter according to claim 1; and
an optoelectronic semiconductor chip.

15. A method for forming a converter for an optoelectronic component, the method comprising:
providing a conversion element for converting a wavelength of electromagnetic radiation which passes through at least a part of the conversion element; and
forming a reflector comprising a reflector material,
wherein the reflector material is formed by sintering,
wherein the reflector material comprises $MgF_2$ and/or an inorganic material as a matrix material, in which a plurality of particles is embedded,
wherein a refractive index of the matrix material amounts to at least 1 and at most 2, and
wherein a refractive index of the particles amounts to at least 1.5.

16. The method according to claim 15, wherein, during sintering, the materials of the reflector material are pressed together.

17. The method according to claim 15, wherein the particles embedded in the matrix material of the reflector material comprise $TiO_2$.

18. The method according to claim 15, wherein the reflector material is formed by spark-plasma-sintering.

19. A material for a reflector of an optoelectronic component, the material comprising:
$MgF_2$ as a matrix material; and
$TiO_2$ particles incorporated in the matrix material,
wherein a particle size distribution D50 of the $TiO_2$ particles is at least 100 nm and less than 15 μm.

20. The converter according to claim 1, wherein a reflectivity of the reflector is at least 90%.

* * * * *